United States Patent
Mimura et al.

[19]

[11] Patent Number: 6,041,494
[45] Date of Patent: Mar. 28, 2000

[54] ELECTRONIC PART MOUNTING METHOD

[75] Inventors: Yoshihiro Mimura, Izumi; Noriaki Yoshida, Ikeda; Junichi Hada, Katano, all of Japan

[73] Assignee: Matsushita Electric Industrial Co., Ltd., Osaka, Japan

[21] Appl. No.: 09/029,477

[22] PCT Filed: Jun. 26, 1997

[86] PCT No.: PCT/JP97/02266

§ 371 Date: Feb. 24, 1998

§ 102(e) Date: Feb. 24, 1998

[87] PCT Pub. No.: WO97/50286

PCT Pub. Date: Dec. 31, 1997

[30] Foreign Application Priority Data

Jun. 27, 1996 [JP] Japan ................................. 8-167056

[51] Int. Cl.[7] ................................................. H05K 3/30
[52] U.S. Cl. ............................. 29/832; 29/721; 29/740; 29/741; 29/837
[58] Field of Search ........................... 29/740, 741, 720, 29/721, 832, 833, 840, 837

[56] References Cited

U.S. PATENT DOCUMENTS 5,383,270  1/1995  Iwatsuka ................................. 29/840
5,704,897  1/1998  Truppe ................................. 600/117

FOREIGN PATENT DOCUMENTS 576099  7/1993  Japan .
637495  4/1994  Japan .

*Primary Examiner*—Lee Young
*Assistant Examiner*—Sean Smith
*Attorney, Agent, or Firm*—Price, Gess & Ubell

[57] ABSTRACT

The maintenance of nozzles is carried out efficiently and smoothly by automatically identifying a defective nozzle, hence contributing to the increase of productivity. A method of mounting electronic components implemented in an electronic component mounting apparatus which includes an electronic component mounting means (7) provided with a plurality of nozzles (13) for attracting by suction and mounting electronic components (14), an imaging means (15) for shooting an image of the electronic component (14) held by the nozzle (13), and a recognition controlling means (16) for analyzing the image of the electronic component (14) recorded by the imaging means (15) to inspect the condition of the electronic component (14) being attracted, comprises the steps of taking an image of a tip surface of the nozzle (13) with the imaging means (15) which has repeated a suction error by a specific number of times, analyzing the image with the recognition controlling means (16) to inspect the condition of the tip surface of the nozzle (13), and judging the said nozzle (13) as a defective nozzle.

17 Claims, 12 Drawing Sheets

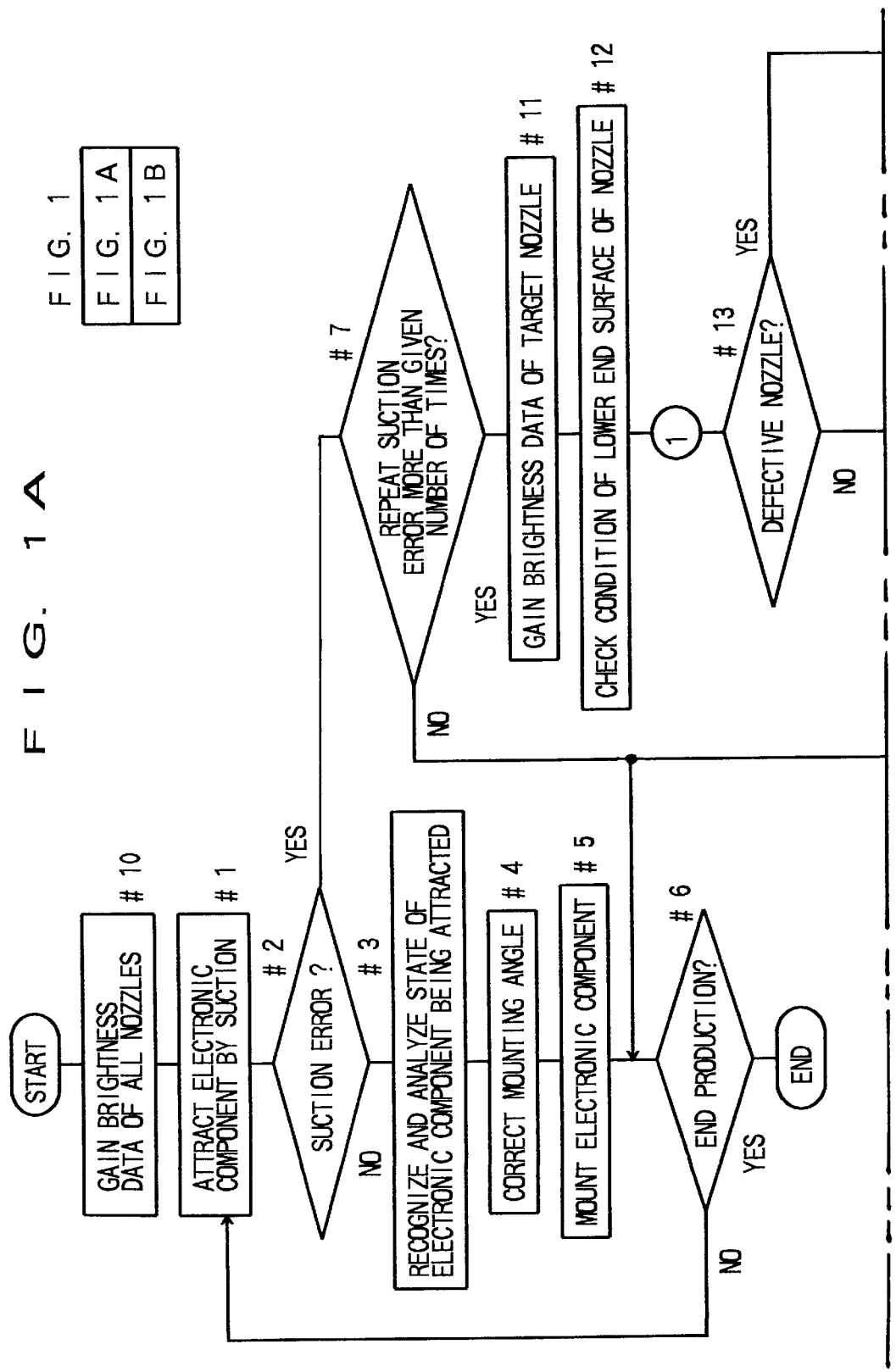

F I G. 4
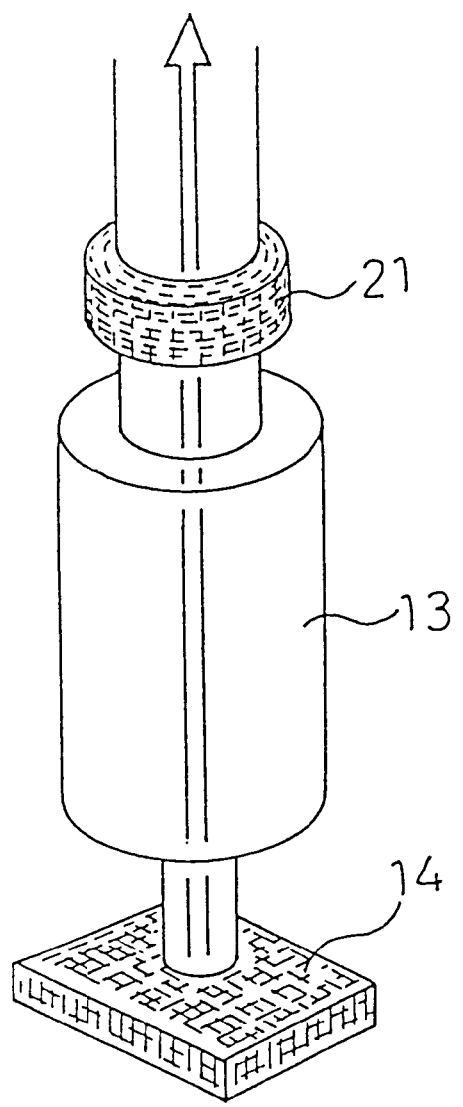

ELECTRONIC PART MOUNTING METHOD

TECHNICAL FIELD

The present invention relates to a method implemented in an electronic component mounting apparatus for mounting electronic components automatically onto a circuit board.

BACKGROUND ART

A conventional electronic component mounting apparatus will be explained referring to FIGS. 9 and 10 which are a schematic view of the apparatus and a flowchart of controlling the same, respectively.

An electronic component feeding means 1 comprises a movable table 2, component feeders 3, and a drive mechanism 4. The component feeders 3 are mounted in a row parallel to each other on the movable table 2 which is driven in the X-axis direction by the drive mechanism 4 including a motor. Each of the component feeders 3 includes a reel 5 for storage of a tape on which a multiplicity of electronic components are carried in a row. As the tape is drawn out to a component feeding position 6, the electronic components are picked up one by one.

An electronic component mounting means 7 comprises a drive mechanism 8, a speed reducer 9, an input shaft 10, an indexing device 11, a rotary body 12, and nozzles 13 (13a to 13d) for picking up electronic components by suction. As power is transmitted from the drive mechanism 8 via the speed reducer 9 to the indexing device 11, a continuous rotating motion of the input shaft 10 is converted to an intermittent rotation of the rotary body 12. The nozzles 13 (13a to 13d) are located at equal intervals about the rotary body 12, each nozzle being separately driven for rotation and vertical movements around and along their respective shafts.

When the component feeding position 6 of the component feeder 3 is defined just below one of the nozzles 13, the nozzle 13 is descended to pick up an electronic component 14 by suction (Step #1). After the nozzle 13 is lifted up, the rotary body 12 rotates to convey the electronic component 14 towards this side in FIG. 9. While being conveyed, the electronic component is examined by an electronic component suction detecting mechanism (not shown) whether it is held by suction or not (Step #2). The nozzle 13 is then positioned just above an imaging means 15 which takes an image of the electronic component 14 held by suction on the nozzle 13. The state of the electronic component 14 being attracted by suction is checked by analyzing the image of the electronic component 14 with a recognition controlling means 16 (Step #3). Based on the analyzed result, the position and angle of the electronic component 14 are corrected (Step #4). The correction is intended for determining the optimum mounting position and angle of the electronic component 14 to a circuit board 17.

The circuit board 17 on which electronic components are mounted is horizontally supported on a board support 18 which is linked to an X-axis drive mechanism 19 and a Y-axis drive mechanism 20 for moving and positioning the circuit board 17 at a desired position in the horizontal plane.

For mounting the electronic component 14 onto the circuit board 17, the circuit board 17 is adjusted to position a mounting location thereon just below the nozzle 13. When the nozzle 13 is descended, it releases and places the electronic component 14 at the mounting location on the circuit board 17 (Step #5). Then, the nozzle 13 is lifted up and returned.

A single electronic component 14 is mounted through carrying out such series of actions. For mounting a plurality of electronic components 14, the series of actions as described above are repeated for each one of the electronic components 14 (Step #6) according to the predetermined data on mounting positions and order.

After a long run of operation for mounting electronic components 14 onto the circuit board 17, the nozzle 13 may be fouled at its tip or damaged inside (e.g. nozzle choking or valve failure), hence failing to perform stable sucking action of the electronic component 14. For example, if the tip of the nozzle 13 attracting the electronic component 14 is fouled, its image taken by the imaging means 15 may appear different from a normal state, causing a recognition error in the recognition controlling means 16 which will fail to calculate for correction. Consequently, the electronic component 14 cannot be correctly mounted. Also, if the nozzle 13 is choked or has a valve failure, it cannot attract the electronic component 14 by suction. These unfavorable states of suction which disturb the mounting operation of the electronic component 14 will be hereinafter referred to as a suction error.

For maintaining a stable action of attracting the electronic component 14, each of the nozzles 13 is monitored at Step #2 whether or not a suction error has occurred. It is then judged if the suction error is repeated on the same nozzle 13 by a given number of times (Step #7). If so, it is judged that the nozzle 13 is defective (Step #8) and it is avoided from use in the following cycle.

This is hereinafter referred to as a faulty nozzle judging function. An operator is at the same time informed that the nozzle has been identified as a defective nozzle.

Upon being informed, the operator stops the operation and views the condition of the nozzle 13 which has been identified as defective. If the nozzle 13 is heavily fouled, the operator takes a proper step such as cleaning the nozzle before restarting the operation.

In such a conventional method implemented in the electronic component mounting apparatus, however, it may happen that the nozzle 13 which works normally is also defined as defective when there is a source of suction error other than the faultiness of the nozzle (for example, when the electronic component 14 has not been properly fed to the component feeding position 6 in the electronic component feeder 1). In that case, the nozzle 13 cannot be used again unless the operator stops the operation and changes the setting of the nozzle from "defective" to "normal". This will produce a downtime of the electronic component mounting apparatus hence decreasing the efficiency of production.

As shown in FIG. 11, when nozzles are actually fouled (with dust or obstacles) during the operation and identified as defective (denoted by the black dots in FIG. 11) by the faulty nozzle judging function, they stay out of use in the following cycles of the production. If a nozzle (denoted by the x marked dot in FIG. 11) is erroneously regarded by the faulty nozzle judging function as defective due to the occurrence of some errors in the electronic component feeder side, it is also kept out of use in the following cycles. Accordingly, while the defective nozzles remain out of use, the production continues with the use of a less number of the nozzles and its efficiency will be declined. Eventually, even if there is the normal nozzles (denoted by the x marked dot in FIG. 11), the number of usable nozzles decreased to null, causing the operation to be stopped.

Also, if the nozzle 13 is judged as defective due to a cause other than the contamination on the nozzle (choking or valve failure), another step is further required to specify the exact cause of faultiness by checking the tip of the nozzle 13. Such an extra step for identifying the source of suction error increases the downtime of the apparatus and decreases the efficiency of production.

As described above, the conventional method for controlling the electronic component mounting apparatus has two problems: the faulty nozzle judging function originally designed for increasing the productivity may interrupt the production; and there may be a substantial loss of time after the operation is stopped upon detecting a defective nozzle.

In view of the foregoing, it is thus an object of the present invention to provide a method of mounting electronic components which can automatically judge the condition of a nozzle which has been identified as defective, and if it is judged that the nozzle is not defective, the nozzle is used in the cycles of operation and when the nozzle is defective, the data on its defective condition is transferred to an operator for implementing efficient and smooth maintenance services to increase the productivity.

DISCLOSURE OF THE INVENTION

A method of mounting electronic components according to the present invention is designed for being performed in an electronic component mounting apparatus which includes an electronic component mounting means provided with a plurality of nozzles for sucking and placing electronic components for surface mounting, an imaging means for shooting an image of the electronic component held by suction on the corresponding nozzle, and a recognition controlling means for analyzing the image of the electronic component recorded by the imaging means to inspect the holding of the electronic component, and particularly, comprises the steps of: taking with the imaging means an image of the tip of the nozzle which has repeated suction error a specific number of times and may be identified as a defective; and analyzing the image with the recognition controlling means to inspect the condition of the tip of the nozzle.

When the condition of the tip surface of the nozzle is detected as faulty, the nozzle is automatically defined as a defective. If it is judged that the condition of the tip surface of the nozzle is normal, the setting of the nozzle as defective is automatically canceled. Also, detailed data about the faulty condition of the tip surface of the nozzle according to a detected result is informed to an operator of the electronic component mounting apparatus.

BRIEF DESCRIPTION OF THE DRAWINGS

FIGS. 1A and 1B are a flowchart showing a procedure for detecting a condition of the tip surface of a defective nozzle according to a first embodiment of the method of mounting electronic components of the present invention;

FIG. 4 is a view showing the nozzle provided with an air pressure sensor in the second embodiment;

BEST MODES FOR CARRYING OUT THE INVENTION (First Embodiment)

Figure 1B:
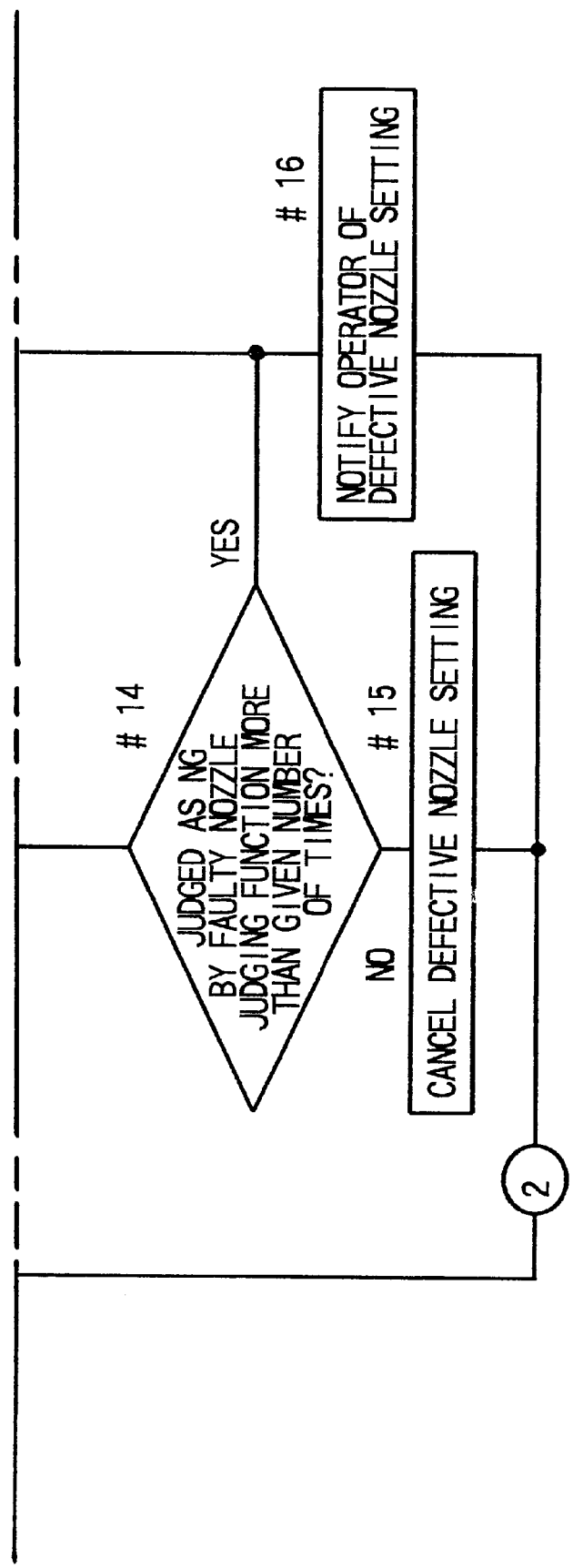
Figure 2:
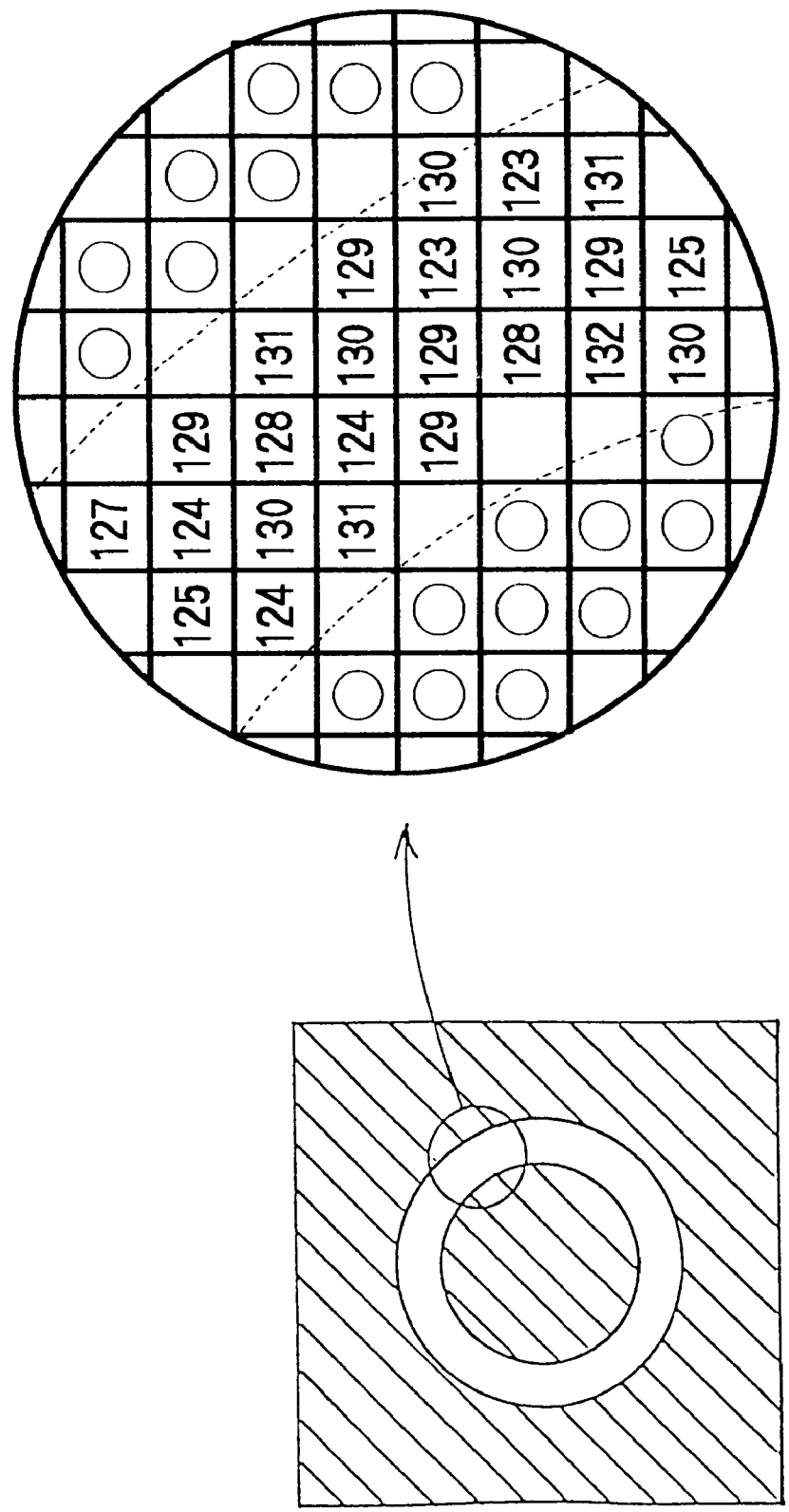
FIG. 2 is an explanatory view showing an exemplary distribution of brightness.
Figure 9:
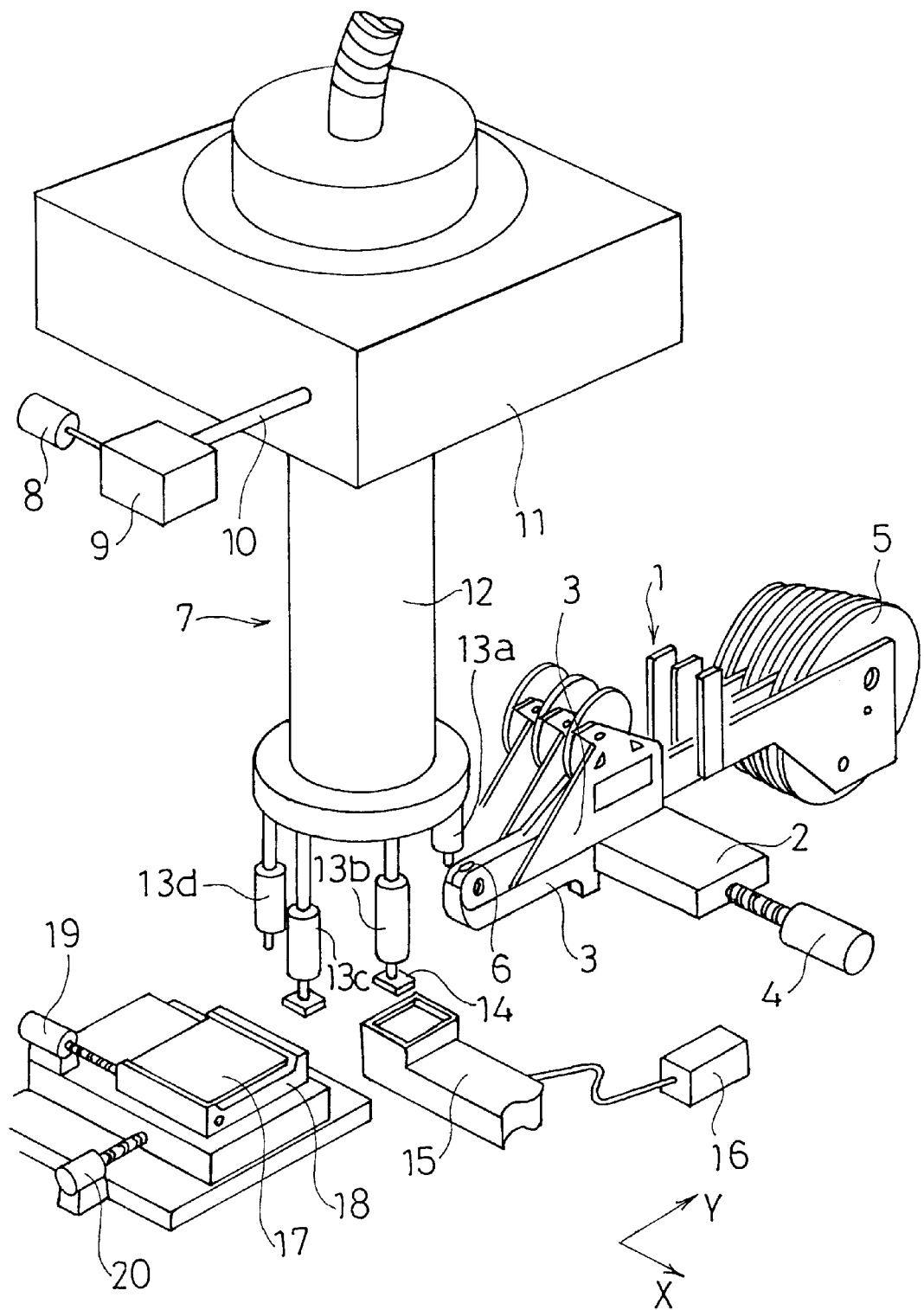
FIG. 9 is a perspective view showing the overall arrangement of a known electronic component mounting apparatus.
Figure 10:
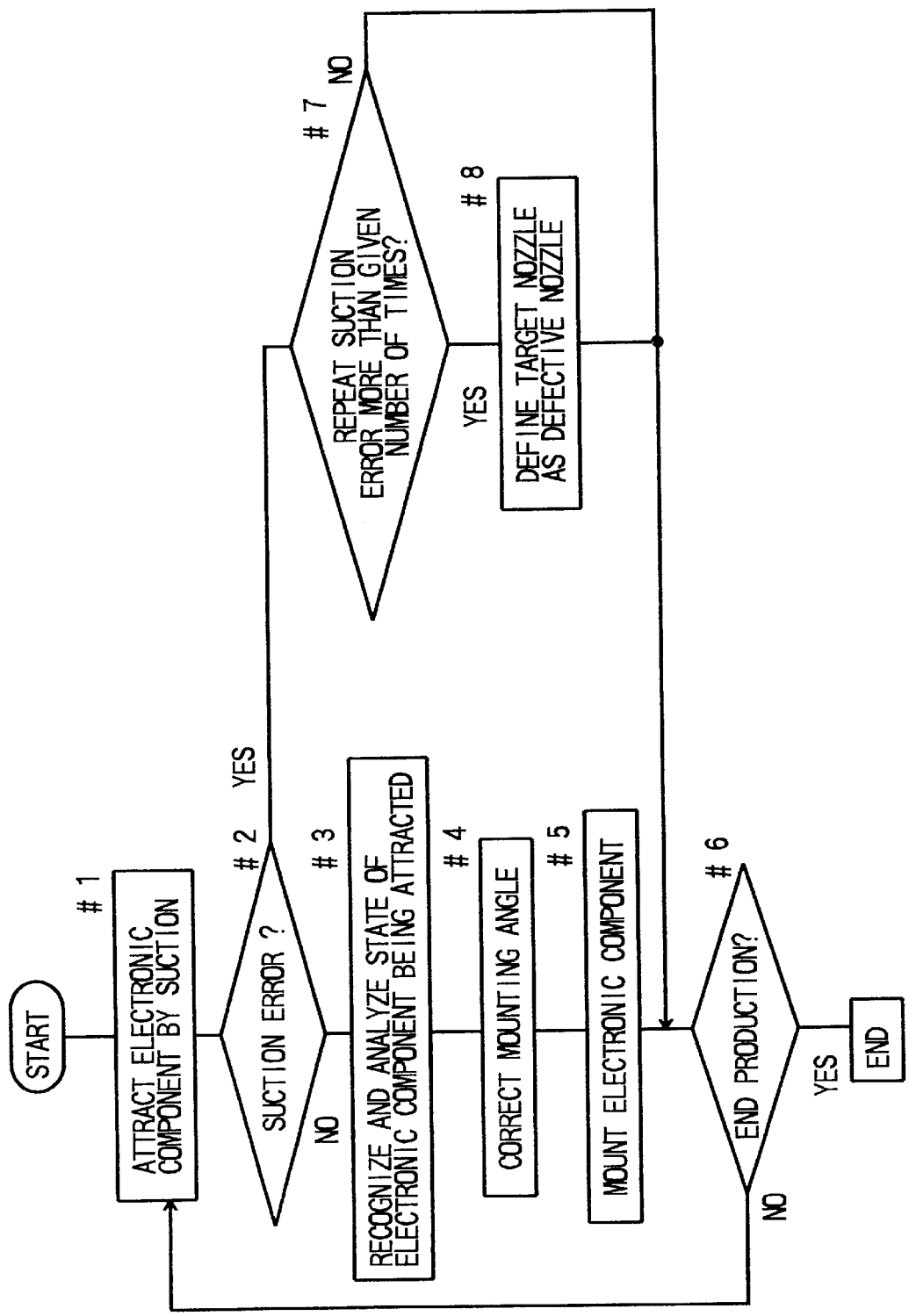
FIG. 10 is a flowchart showing a procedure of the conventional method.
Figure 11:
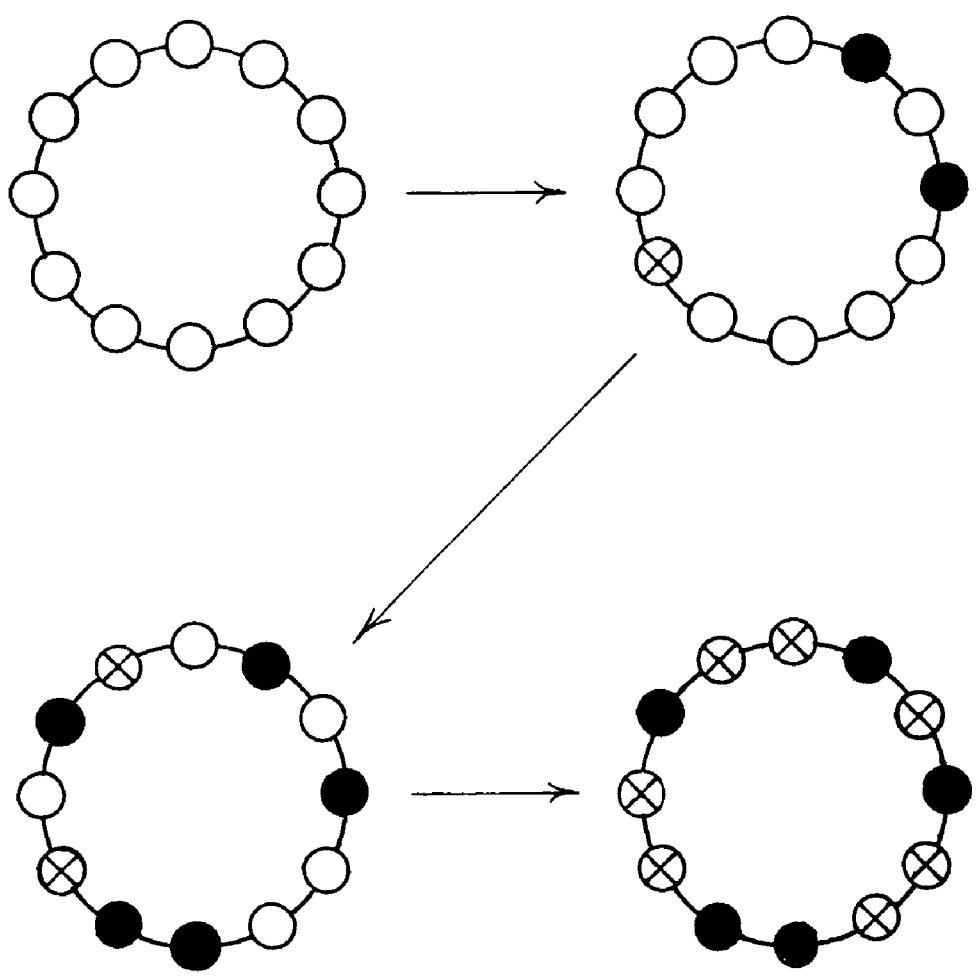
FIG. 11 is an explanatory view showing reduction of available nozzles in the conventional method.

A method of mounting electronic components according to a first embodiment of the present invention will be described referring to FIGS. 1 and 2. The overall arrangement and control of an electronic component mounting apparatus are identical to those of the conventional method previously described in conjunction with FIGS. 9 and 10 and will only be explained in respect of different points.

This embodiment is designed for subjecting the tip of a nozzle which is identified as defective by the faulty nozzle judging function to a brightness analysis and determining the state of the nozzle from an analyzed result. FIG. 1A and FIGS. 1B illustrate a flow chart in which Step #10 is added to the procedure of the conventional method shown in FIG. 10 while the existing Step #8 is replaced by a series of Steps #11 to #16.

The brightness analysis defined herein comprises shooting an object with a CCD camera or the imaging means 15, saving its light and shade image into a memory, and measuring the brightness of each pixel in the light and shade image to recognize the condition of the object. (The degree of brightness may be expressed by the number from 0 to 255, 0 being the darkest and 255 being the brightest, in a hardware having a resolution power of 256 level of gradation.)

Before starting the operation, images of the tips of all the nozzles are recorded with the imaging means and subjected to the brightness analysis of the recognition controlling means to have brightness data in the normal state (Step #10). The brightness data may be brightness distribution in which brightness is allocated to each pixel of the light and shade image of the nozzle at its tip as shown in FIG. 2 (the pixel being denoted by a square blank and the brightness being denoted by a numeral). The brightness data may also be average brightness obtained by the brightness distribution, maximum/minimum brightness, or area (number of pixels having a brightness more than a given range). In the following description, the brightness distribution, the average brightness, the maximum and minimum brightness, and the area of a nozzle N under a normal state before starting the operation will be expressed as BODIS(N), BOAVE(N), BOPEAK(N), and BOAREA(N), respectively.

When a given nozzle i is defined as defective by the faulty nozzle judging function (Step #7) during the operation, an image of its tip surface is taken by the imaging means and subjected to the brightness analysis with the recognition controlling means to obtain brightness data (Step #11).

The brightness distribution, the average brightness, the maximum and minimum brightness, and the area of the nozzle i are respectively expressed as BDIS(i), BAVE(i), BPEAK(i), and BAREA(i).

The obtained brightness data is compared with the original brightness data of the target nozzle before the production (Step #12). When the brightness data is the brightness distribution, the following formula (1) is used for the comparison. When the data represents the maximum and minimum brightness, the average brightness, or the area, the formula (2), (3), or (4) is used respectively. If the difference exceeds a specific value Δ, (which may be experimentally obtained by analyzing the brightness of a nozzle at its tip in the normal condition and the fouled condition), it is judged that the target nozzle is defective due to contamination or the like (Step #13). This is followed by informing the operator of the abnormal condition of the nozzle and identifying the target nozzle as defective so as not to-be used in the succeeding cycles (Step #16).

$$|BODIS(i)-BDIS(i)|>\Delta \quad (1)$$

$$|BOAVE(i)-BAVE(i)|>\Delta \quad (2)$$

$$|BOPEAK(i)-BPEAK(i)|>\Delta \quad (3)$$

$$|BOAREA(i)-BAREA(i)|>\Delta \quad (4)$$

When the target nozzle is not defective according to the judgment, it is checked whether or not the target nozzle has been judged as defective more than a predetermined number of times (Step #14). If the said nozzle comes under this condition, it is assumed that there may be other faults around the target nozzle (e.g. nozzle choking or valve failure). The operator is thus informed of the presence of the fault and it is determined that the target nozzle is defective so as not to be used in the next cycles (Step #16).

When the difference between the two brightness data of the target nozzle in the original condition before the operation and in the current condition does not exceed the specific value Δ, as well as the number of times for being judged as defective with the faulty nozzle judging function is less than the predetermined value, the defective nozzle setting is canceled (Step #15) to allow the target nozzle to be used in the next cycle of operation.

(Second Embodiment)

The nozzle defined as defective by the faulty nozzle judging means is subjected to brightness analysis in the first embodiment, based on which the condition of the nozzle at its tip surface is examined. The faults on the end surface of the nozzle, however, may also include physical damage such as chipping other than contamination.

For that reason, a method of detecting more detailed information about the faulty condition, such as fouling or damage, on the tip of a nozzle which has been judged as defective by the brightness analysis according to the first embodiment will be described.

Figure 5:
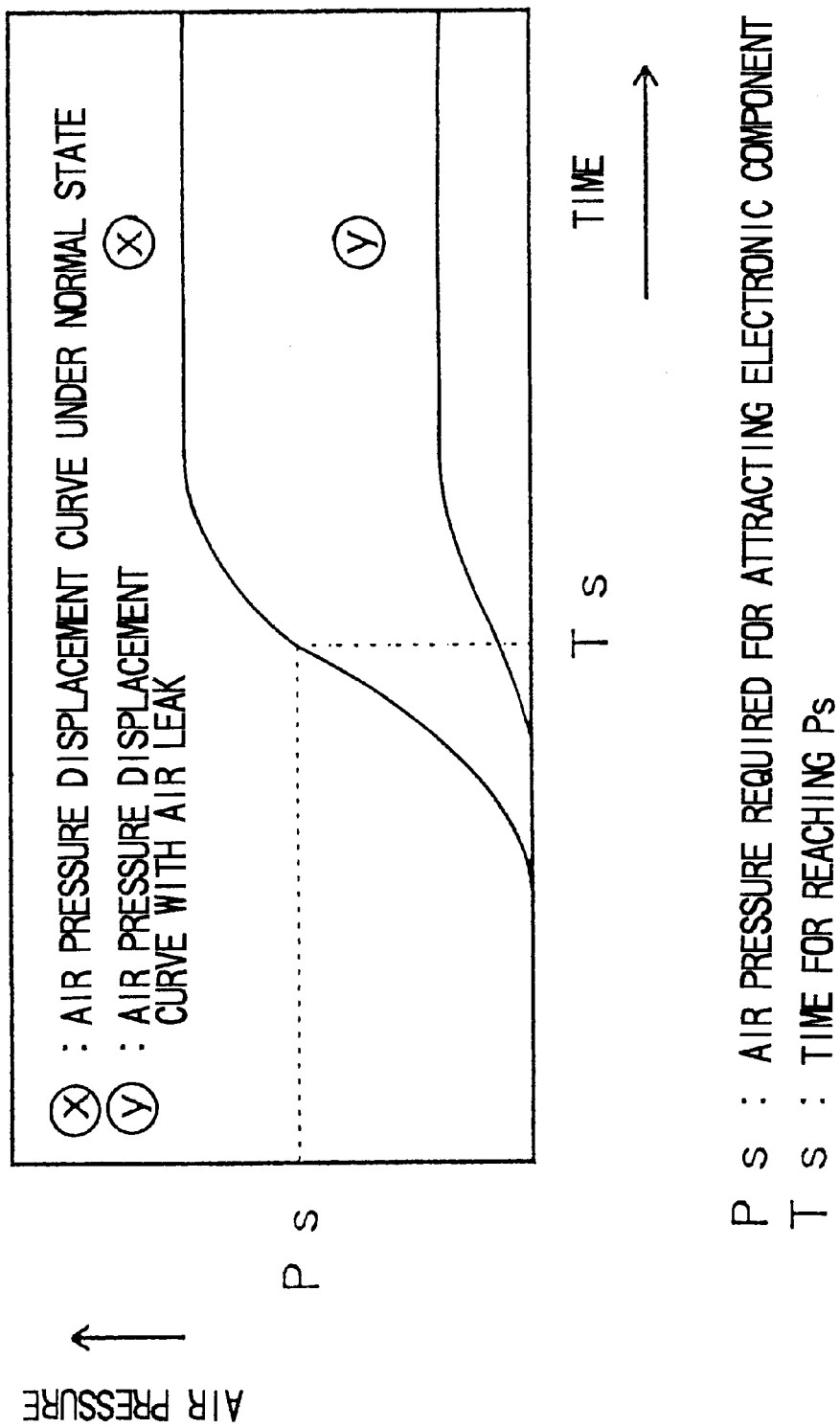
FIG. 5 is a diagram showing two variations of the air pressure on the nozzle with the presence and the absence of air leakage respectively.

If the tip of the nozzle is seriously chipped, it will cause air leakage between the nozzle and an electronic component to be held by suction on the nozzle. This may become a source of suction error as shown in FIG. 5 because the air pressure (vacuum) required for attracting the electronic component cannot be supplied. Utilizing such characteristics, it is possible to detect a serious chip on the target nozzle 13 by providing an air pressure sensor 21 to the nozzle 13 as shown in FIG. 4 and detecting the air pressure of the target nozzle 13 in addition to the brightness analysis process of the first embodiment.

Figure 3:
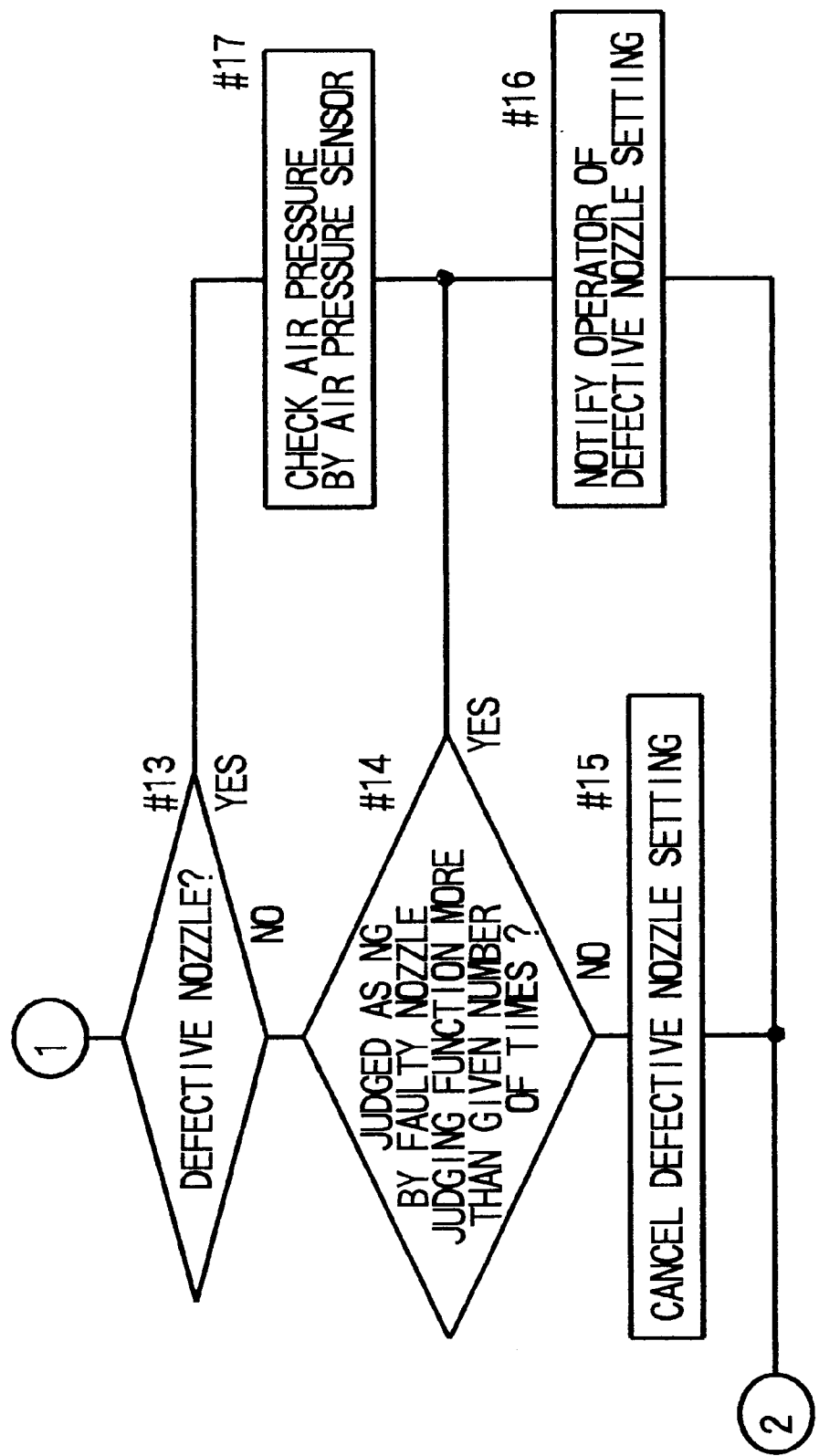
FIG. 3 is a flowchart showing a procedure of a second embodiment of the method of mounting electronic components according to the present invention in which a step of detecting air pressure is added.

The detection can be implemented by Step #17 as shown in FIG. 3 added to the flow chart of the brightness analysis shown in FIG. 1. Thus, as shown in FIG. 5, a predetermined air pressure displacement curve can be stored and compared with a measurement of a target nozzle 13.

(Third Embodiment)

While the method of detecting a critical damage has been described in the second embodiment, a method of this embodiment is intended for detecting the end surface of the nozzle more accurately when it is slightly chipped which may not even cause air leakage.

Figure 7:
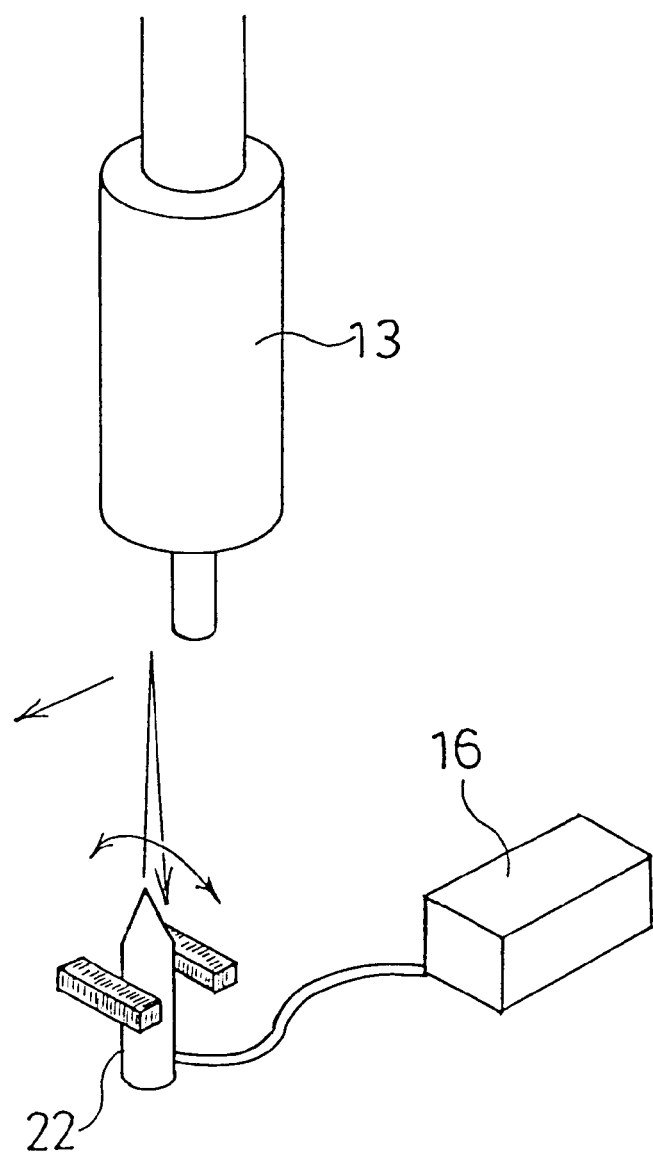
FIG. 7 is a view showing the nozzle provided with a height sensor in the third embodiment.
Figure 8A:
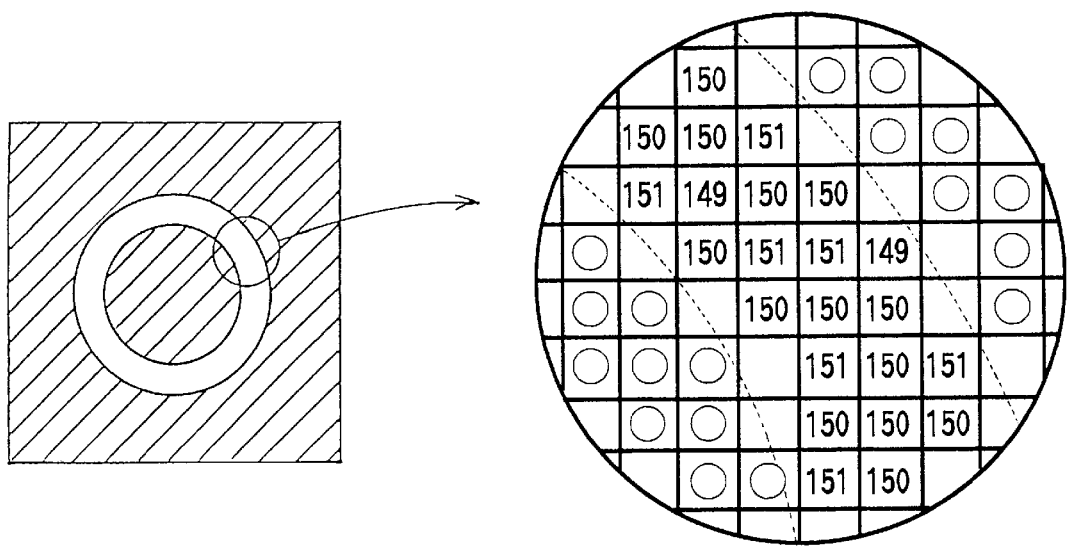
FIGS. 8A and 8B are an explanatory view showing exemplary conditions of the tip of the nozzle detected with a three-dimensional sensor in the third embodiment.
Figure 8B:
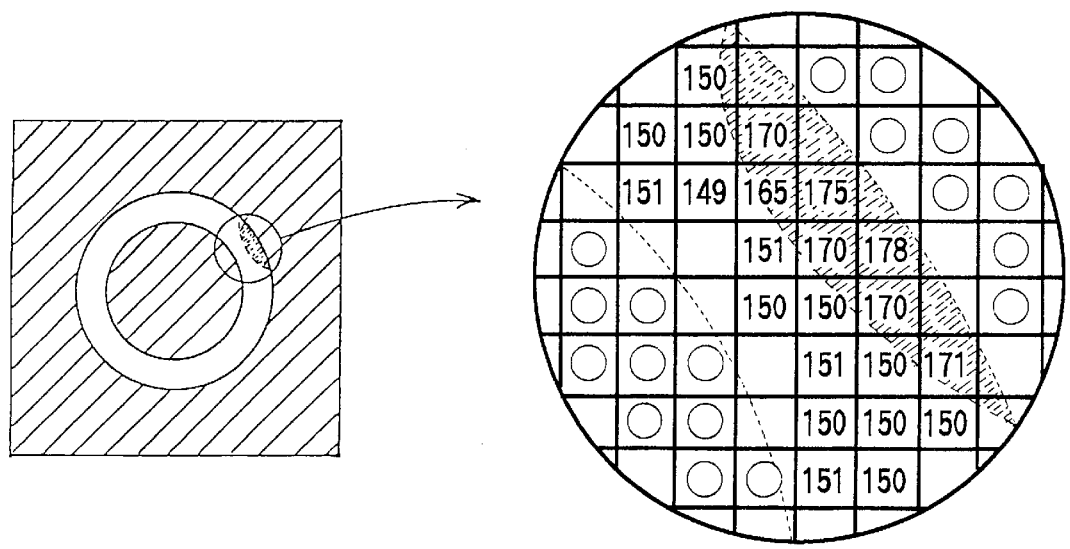

When the tip of the nozzle is chipped, its surface is uneven. It is thus possible to detect a chip on the tip surface of the nozzle 13 by obtaining the data of height on the tip surface of the target nozzle with the use of a three-dimensional sensor 22 as shown in FIG. 7 in addition to the brightness analysis of the first embodiment. For example, if the detected result as shown in FIG. 8B is different from the normal condition as shown in FIG. 8A, which has been detected before the operation, it is judged that there is a chip on the end surface of the nozzle.

Figure 6:
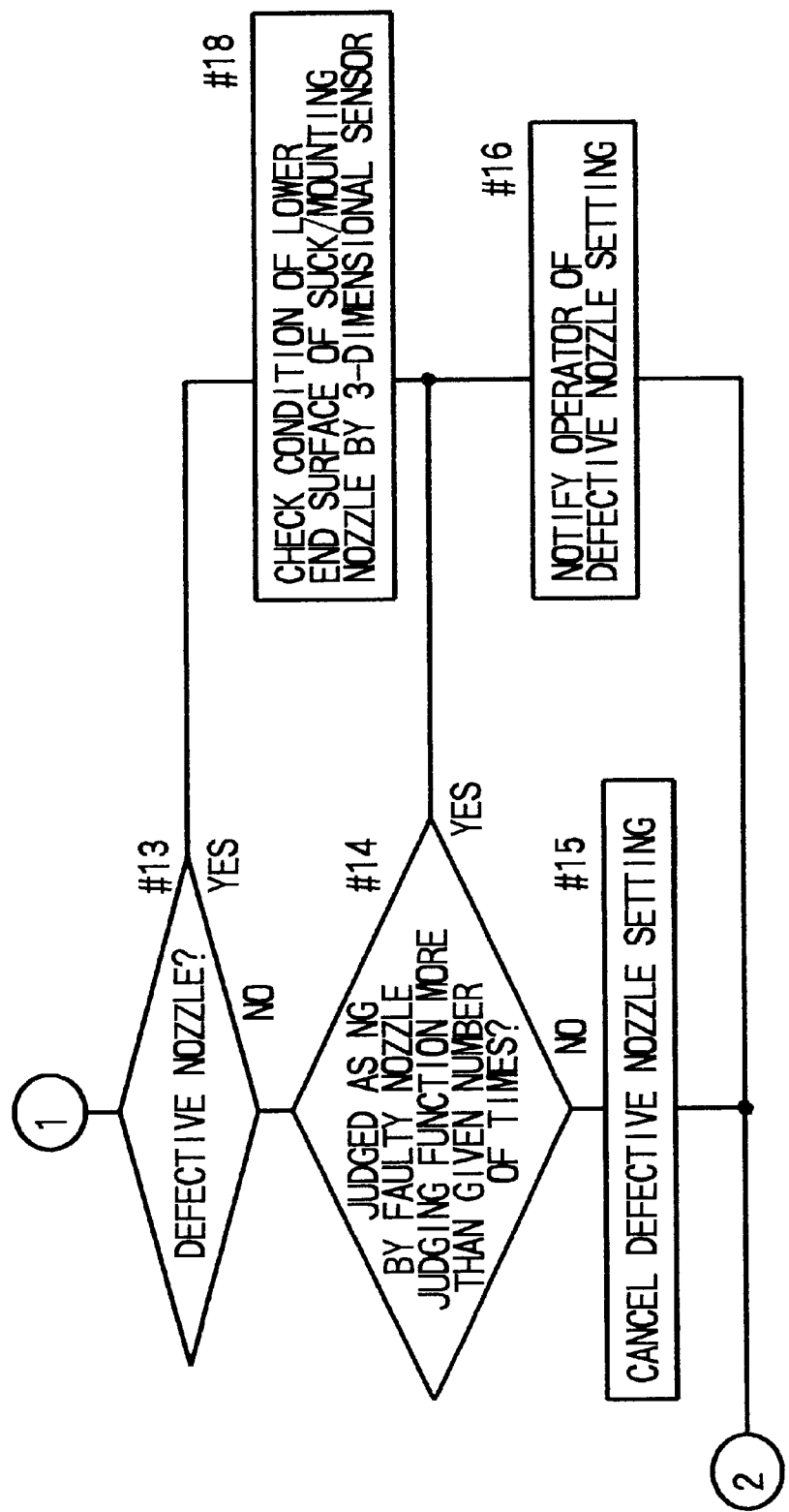
FIG. 6 is a flowchart showing a procedure in a third embodiment of the method of mounting electronic components according to the present invention in which a step of detecting a height is added.

The detection of this embodiment can be implemented by Step #18 as shown in FIG. 6 added to the flow chart of the brightness analysis shown in FIG. 1.

INDUSTRIAL APPLICABILITY

According to the method of mounting electronic components of the present invention, the condition of the tip surface of the nozzle for picking up an electronic component by suction is examined with the use of an imaging means and a recognition controlling means for judging a given nozzle as defective which has repeated a suction error by a given number of times. Accordingly, declination of productivity caused by erroneous defective nozzle judgment will be prevented and downtime between the shut off and restart of the production will be eliminated. The present invention is thus favorably applied to an electronic component mounting apparatus for mounting electronic components automatically onto a circuit board.

We claim:

1. In a method of mounting electronic components implemented in an electronic component mounting apparatus which includes an electronic component mounting means having a plurality of nozzles for attracting by suction and mounting electronic components, an imaging means for shooting an image of the electronic component held by one of the nozzles, and a recognition controlling means for analyzing images recorded by the imaging means to inspect the condition of the electronic component, the improvement of a method of determining the status of a nozzle, comprising the steps of:

storing brightness data representative of a functional nozzle tip;

determining if a suction error for mounting the electronic components has occurred;

taking an image of a nozzle tip which has experienced a suction error for a specific number of times with the imaging means to provide brightness data;

analyzing the brightness data of the image taken of the nozzle tip by comparing the stored brightness data with the image brightness data; and judging if the nozzle is a definitive nozzle as a result of the analyzing step.

2. The method of mounting electronic components according to claim 1 further including displaying to an operator data on the condition of the nozzle tip.

3. The method of mounting electronic components according to claim 1, wherein the brightness data is representative of average brightness.

4. The method of mounting electronic components according to claim 1, wherein the brightness data is representative of maximum and minimum brightness.

5. The method of mounting electronic components according to claim 1, wherein the brightness data is representative of brightness distribution.

6. The method of mounting electronic components according to claim 1, wherein the brightness data is representative of an area of brightness.

7. The method of mounting electronic components according to claim 1 further including an air pressure sensor for measuring the suction and steps of measuring the air pressure and comparing the measured air pressure with a predetermined air pressure value to determine a defective nozzle.

8. The method of mounting electronic components according to claim 1 further including a three-dimensional sensor for measuring a physical dimension of the nozzle and steps of measuring the physical dimension of the nozzle and comparing the measured physical dimension with a predetermined physical dimension to determine a defective nozzle.

9. A method of measuring the operability of suction nozzles which mount electronic components in an automatic electronic component mounting apparatus, comprising the steps of:

storing brightness data representative of an acceptable functioning nozzle;

imaging a nozzle to provide a measurement of brightness data; and comparing the measured brightness data with the stored brightness data to determine a defective nozzle.

10. The method of claim 9 further including apparatus for determining the proper alignment of the electronic component by a nozzle and the steps of determining which nozzle to image based on an initial determination of an improper alignment of the electronic component.

11. The method of claim 10 further including apparatus for storing the number of improper alignments determined of the nozzle in a predetermined time period and the steps of comparing the stored number of improper alignments with a predetermined maximum number of improper alignments, and when the stored number is equal to the predetermined maximum number indicating a defective nozzle regardless of the result of the comparison of the brightness data.

12. The method of claim 11 further including an air pressure sensor for measuring the suction and the steps of measuring the air pressure and comparing the measured air pressure with a predetermined air pressure value to determine a defective nozzle.

13. The method of claim 11 further including a three-dimensional sensor for measuring a physical dimension of the nozzle and the steps of measuring the physical dimension of the nozzle and comparing the measured physical dimension with a predetermined physical dimension to determine a defective nozzle.

14. In an apparatus for mounting electronic components on a substrate with a plurality of suction nozzles respectively securing an electronic component from a source of electronic components and subsequently releasing the electronic component on the substrate in a proper alignment with the substrate, the improvement of apparatus to verify the operability of individual suction nozzles comprising:

means for storing brightness data representative of an acceptable nozzle;

an image taking member for imaging a nozzle to provide a measurement of brightness data; and means for comparing the measured brightness data with the stored brightness data to determine the operability of the nozzle.

15. The invention of claim 14 further including apparatus for determining the proper alignment of the electronic component by a nozzle and measuring the number of improper alignments, apparatus for storing the number of improper alignments determined of the nozzle in a predetermined time period and means for comparing the stored number of improper alignments with a predetermined maximum number of improper alignments, and when the stored number is equal to the predetermined maximum number indicating a defective nozzle regardless of the result of the comparison of the brightness data.

16. The invention of claim 15 further including an air pressure sensor for measuring the suction and means for comparing the measured air pressure with a predetermined air pressure value to determine a defective nozzle.

17. The invention of claim 15 further including a three dimensional sensor for measuring a physical dimension of the nozzle and means for comparing the measured physical dimension with a predetermined physical dimension to determine a defective nozzle.

* * * * *